United States Patent [19]
Kreider

[11] Patent Number: 5,618,389
[45] Date of Patent: Apr. 8, 1997

[54] PROCESS FOR PRODUCING TRANSPARENT CARBON NITRIDE FILMS

[75] Inventor: Kenneth G. Kreider, Potomac, Md.

[73] Assignee: The United States of America as represented by the Secretary of Commerce, Washington, D.C.

[21] Appl. No.: 671,633

[22] Filed: Jun. 28, 1996

Related U.S. Application Data

[62] Division of Ser. No. 328,806, Oct. 25, 1994, Pat. No. 5,573,864.

[51] Int. Cl.⁶ .................................................. C23C 14/34
[52] U.S. Cl. ........................... 204/192.15; 204/192.1; 204/192.11; 204/192.12; 204/192.26
[58] Field of Search ........................... 204/192.15, 192.1, 204/192.11, 192.12, 192.26

[56] References Cited

U.S. PATENT DOCUMENTS

| | | | |
|---|---|---|---|
| 4,664,976 | 5/1987 | Kimura et al. | 428/336 |
| 4,851,095 | 7/1989 | Scobey et al. | 204/192.12 |
| 5,110,679 | 5/1992 | Haller et al. | 428/408 |
| 5,156,725 | 10/1992 | Doktycz et al. | 204/192.16 |
| 5,225,057 | 7/1993 | LeFebvre et al. | 204/192.13 |
| 5,232,570 | 8/1993 | Haines et al. | 204/192.16 |
| 5,405,515 | 4/1995 | Fang | 204/164 |

*Primary Examiner*—Archene Turner
*Attorney, Agent, or Firm*—Jagtiani and Associates

[57] ABSTRACT

The present invention provides transparent carbon nitride films, processes for making them and compositions of matter comprising them. The films are made using a magnetron sputter gun and a ion beam. Low pressure and high velocity atoms and ions are an important part of the present invention.

15 Claims, 2 Drawing Sheets

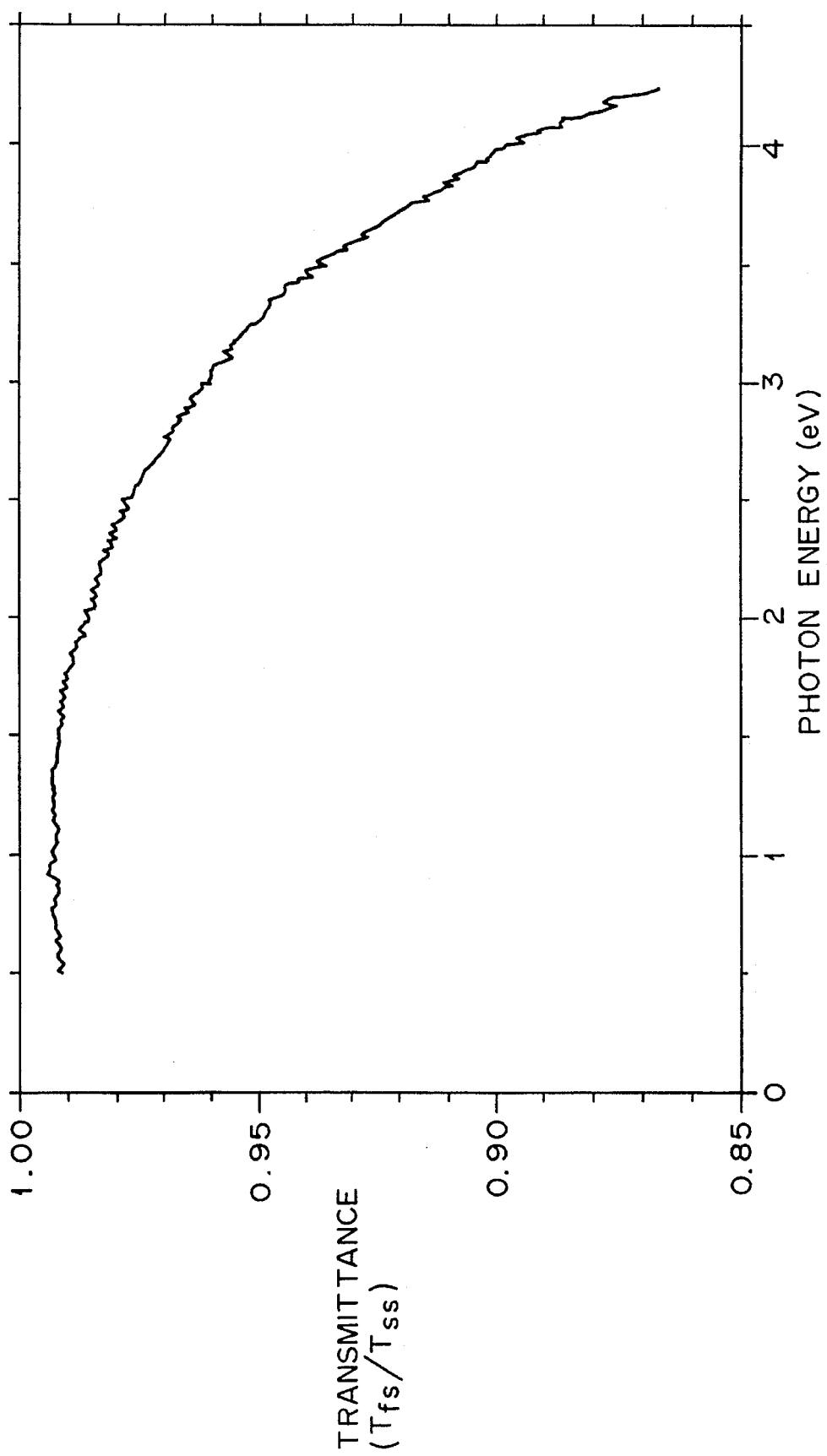

5,618,389

PROCESS FOR PRODUCING TRANSPARENT CARBON NITRIDE FILMS

This application is a Division of application Ser. No. 08/328,806, filed Oct. 25, 1994, now U.S. Pat. No. 5,573,864.

BACKGROUND OF THE INVENTION

1. Field of the Invention

The present invention relates generally to transparent carbon nitride films and more particularly to transparent carbon nitride films for use in optical or solar energy devices. It also relates to processes for making transparent carbon nitride films, and compositions of matter comprising transparent carbon nitride films.

2. Description of the Prior Art

Theoretically predictions of some of the outstanding properties of carbon nitride ($C_3N_4$) have been made by Liu and Cohen in 245 *Science* 841 (1989). Because of the very short, high energy, covalent bonds in the β silicon nitride ($Si_3N_4$) structure, $C_3N_4$ was predicted to have a higher bulk modulus and hardness than diamond. Although recent efforts have produced up to 5% of the desirable $C_3N_4$ structure by sputter deposition at 2.5 Pa (Hailer U.S. Pat. No. 5,110,679) and 26 Pa (Morton et al., 73(1) *Phys. Rev. Lett.* 118 (1994)) and by pulsed laser deposition in the presence of an RF plasma at 100 Torr (Niu et al., 261 *Science* 334 (1993)), neither the optical properties nor the hardness of these Ellms were reported. Both processes produced thin Ellms which had small fractions of the $C_3N_4$ beta structure as indicated by crystal diffraction. The crystallinity of films produced by the laser deposition process was indicated by electron diffraction measurements and the crystallinity of the films from the 2.5 Pa sputtering process was indicated by X-ray diffraction measurements. In both cases more than 95% of the material was amorphous, but other physical properties were not reported. Amorphous films of carbon and nitrogen have also been produced in a capacitively coupled rf plasma reactor at 40 Pa (Han et al., 65(9) *Solid State Comm.* 921 (1988)) and by RF sputtering in nitrogen at 3 Pa (Cuomo et al. 16(2) *J. Vac. Sci. Tech.* 299 (1979)).

SUMMARY OF THE INVENTION

It is therefore an object of the present invention to provide transparent carbon nitride films useful for optical and solar cell devices.

It is a further object to provide process by which the transparent carbon nitride films of the present invention can be made.

It is a further object to provide compositions of matter comprising transparent carbon nitride films.

BRIEF DESCRIPTION OF THE DRAWINGS

The invention will be further described in conjunction with the accompanying drawings, in which:

FIG. 2 is a plot of the transmittance of a carbon nitride film, $T_{fs}$, compared to the transmittance of the glass slide substrate, $T_{ss}$, as a function of photon energy.

DETAILED DESCRIPTION OF THE INVENTION

Figure 1:
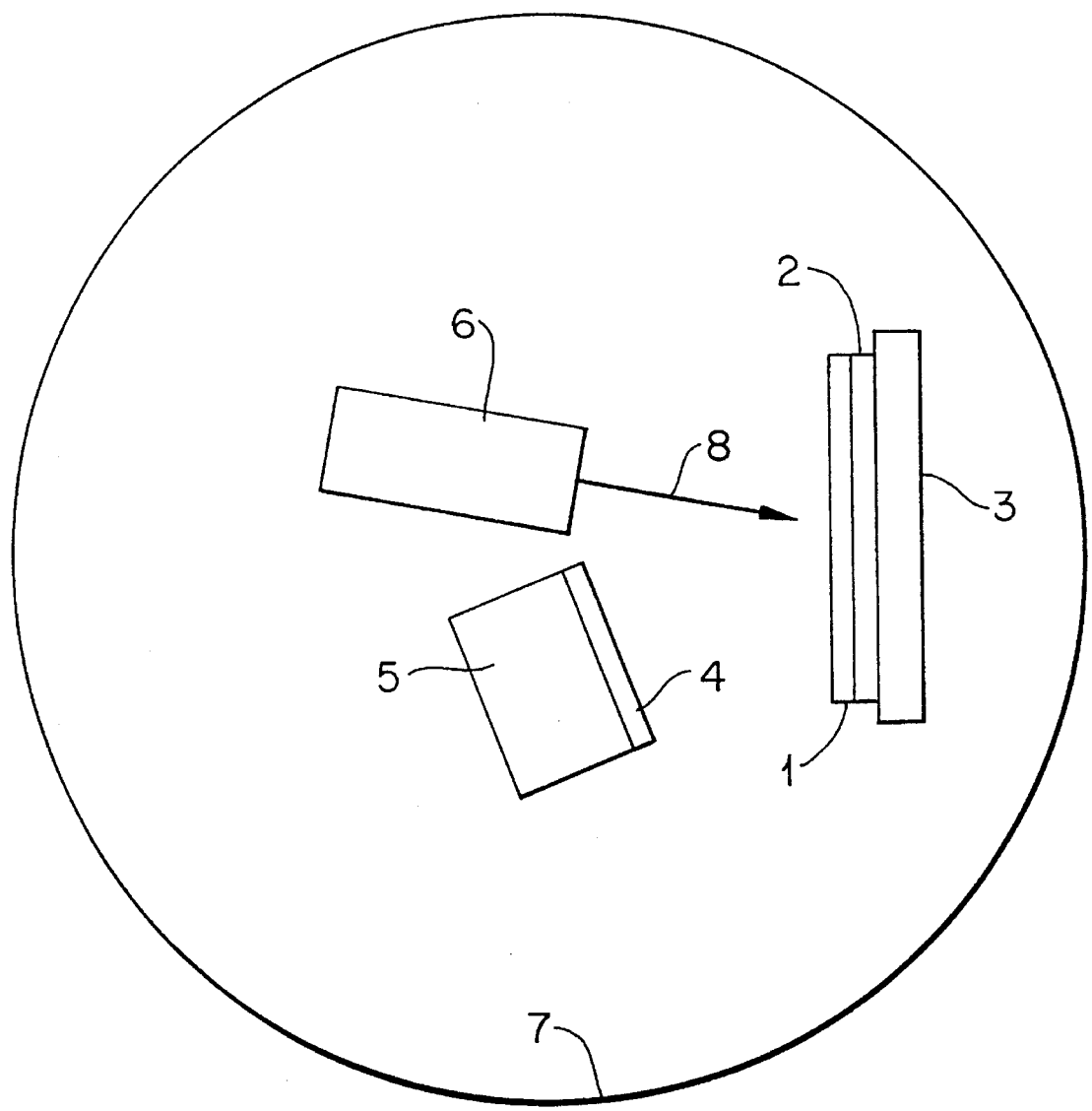
FIG. 1 is a drawing of components of the fabrication process.

The present invention discloses transparent carbon nitride films and process for making them. The films themselves are useful for optical and tribological coatings and for solar cell devices. An additional beneficial property of the present films, in addition to their transparency, is their hardness. As a result of their hardness the films are scratch resistant. Possible applications would include lenses, windows, and mirrors where durability is often limited by scratches or other means of surface damage.

The processes by which the present films are made is new in that low pressure and a high velocity ion beam are used simultaneously. In order to fully understand the process by which these films can be made, reference to FIG. 1 may be helpful.

FIG. 1 is a drawing of the components of the fabrication process. In the Figure: 1 represents the growing carbon nitride film, 2 the substrate (Si, $SiO_2$, glass, etc.), 3 the substrate holder, 4 the carbon sputter target, 5 the planar magnetron, 6 the ion beam source, 7 the vacuum chamber wall, and 8 the nitrogen ion beam. When in use, the chamber is evacuated according to the specifications in the present application. The ion beam may then be used to clean the substrate surface. Sputter deposition of the carbon and simultaneous irradiation by high velocity nitrogen is the last step.

Combining low pressure and high velocity nitrogen atoms and ions ("atoms" and "ions" used herein interchangeably) enable nitrogen atoms to collide with the initial carbon atoms and then the growing film at higher energies. The process takes place at significantly lower pressures than previously described processes: at pressures less than 2.5 Pa. Moreover, a beam of ionized nitrogen is simultaneously directed on the substrate to provide the necessary kinetic energy to generate the high energy diamond-like tetrahedral bond between the carbon and nitrogen. Indeed, prior to the present disclosure, artisans would have not believed that the ionization instruments would function properly using these parameters.

The low pressure avoids "thermalization" of the nitrogen ions and atoms before they strike the surface of the substrate. Thermalization is caused by collisions between the nitrogen molecules of the pressure vessel atmosphere, and, in previous processes, resulted in a loss of energy by the atoms and ions. Therefore, reduction of the pressure of the atmosphere in the sputtering chamber minimizes thermalizing collisions and maintains the high kinetic energy of ions and atoms striking the substrate, giving sufficient energy to carbon and nitrogen on the substrate surface to promote formation of the high-binding energy C-N bond.

The ion beam used in the present process provides a well-controlled source of reactive, high kinetic energy nitrogen atoms to form the carbon nitride film when activated simultaneously with a flux of sputtered carbon atoms. The transparent films produced have not been described previous to the present disclosure.

Therefore, the present invention provides a transparent carbon nitride film. Preferably, the film comprises between 25 to 45% nitrogen.

The present invention also provides a process for producing transparent carbon nitride films comprising: sputter-depositing carbon atoms from a carbon target using a magnetron sputter gun; and, simultaneously depositing nitrogen atoms from an ion beam source in an atmosphere of less than 2.5 Pa of nitrogen gas. A process wherein the sputter pressure of nitrogen is from 0.2 to 0.3 Pa is preferred. Although pressures of 0.2 to 0.3 are preferred, pressures less than 2.5 Pa will produce transparent carbon nitride films.

The magnetron power of the present invention may be either dc or rf, and can be from 100 to 400 W/20 cm². The range of 100 to 400 W/20 cm² is equal to the range of 5 to 20 W/cm². A preferred process of the present invention is one wherein the magnetron sputtering is rf, and is at 150 to 200W/20 cm². Most preferred is a process wherein 10 W/cm² is used.

The ion beam voltage need only be sufficient to provide the carbon/nitrogen interaction with enough energy to form the $sp^3$ high energy bond. For example, voltages ranging from 20 to 500 V are acceptable. Preferred process of the present invention are those which utilize voltages in the range of 20 to 200 V. Most preferred are processes wherein the ion beam has a voltage range from 50 to 100 V and the amperage is in the range of 5 to 10 mA.

Any ion beam current which provides the energy sufficient to form high energy $sp^3$ bonds between the carbon and nitrogen is within the scope of this invention. Amperes ranging from 2 to 10 mA are preferred.

The substrate material of the present invention may be any substrate which will accept a film of carbon nitride made by the processes described. Preferred substrates include silicon oxides, aluminum oxides, fused quartz, glass, copper, PMMA, polycarbonates, and nickel alloys. The most preferred substrate for use in the present invention is a transparent glass. The glass may be of any structure, for example, it may be a soda lime silicate or a borosilicate glass.

The ion source to target distance can be any distance whereby the $sp^3$ high energy bonds will form. The acceptable distance will depend on the voltage of the beam, the amperage of the beam, the purity of the carbon and nitrogen, and other factors within the knowledge of those in the art. A preferred process of the present invention maintains a ion source to target distance from 5 to 15 cm. Most preferred is a process wherein the ion source to target distance is 10 cm.

The substrate temperature during processes of the present invention may be any temperature which allows the formation of the $sp^3$ high energy carbon-nitrogen bonds. A preferred substrate temperature range is from 50 to 200 degrees centigrade.

Moreover, the present invention provides compositions of matter which incorporate at least one of the transparent carbon nitride films of the present invention. Preferably, the composition of matter comprises a transparent carbon nitride film and substrate, the film and the substrate being cooperatively linked by the process of the present invention. Most preferred is a composition of matter of above, in which the substrate is chosen from the group consisting of silicon oxide, aluminum oxide, fused quartz, glass, copper, PMMA, polycarbonate and nickel alloys. Most preferred is a composition of matter wherein the substrate chosen is a transparent glass. The glass may be of any structure, for example, it may be a soda lime silicate or a borosilicate glass.

Furthermore, skilled artisans will realize that more than one film may be desirable as a composition of matter. For instance, it would be beneficial for some applications to use a first film, in direct contact with the substrate, and then a second film, in contact with the first film. The first film could provide bonding strength and the second provide superior durability than the first. Combinations of films are included in the present invention.

For example, and not by way of limitation, the following may be helpful in elucidating the present invention.

Example 1: Deposition of transparent carbon nitride film

The chamber was evacuated to less than $10^4$ Pa ($10^{-6}$ Torr) before refilling with the ion beam with 0.2–0.5 Pa of nitrogen gas. The ion beam was used to clean the substrate surface after normal solvent and ultraviolet cleaning. The 2–10 minute ion beam irradiation is followed by planar magnetron sputter deposition of a high purity graphite target while a simultaneous ion beam of nitrogen impacts and reacts with the growing film.

Example 2: Analysis techniques used

The films produced on silicon wafer and glass substrates ranged in thickness from 40–2000 nm and were evaluated by wavelength dispersive X-ray (WDS) analysis, X-ray photoemission spectroscopy (XPS), Raman spectroscopy, transmission electron microscopy (TEM), optical attenuation spectrometry, electron diffraction, and hardness testing. These tests indicate that the best films have greater than 35% nitrogen (EDX), are primarily amorphous (electron diffraction), and have evidence of triplet C-N bonds (Raman). The XPS data indicate more than one type of nitrogen bonds.

Example 3: Transmittance analysis

FIG. 2 is a plot of the transmittance of a carbon nitride film, $T_{fs}$, compared to the transmittance of the glass slide substrate, $T_{ss}$, which was produced by the process described above as a function of photon energy.

Example 4: Hardness analysis

As can be seen in FIG. 2, the carbon nitride film has a transmittance compared to the glass substrate of at least 95% for photon energies of 0.5 to 3.1 eV. Because the visible spectrum corresponds to photon energies of approximately 1.8 to 3.1 eV, the carbon carbon nitride film has a transmittance of at least 95% throughout the visible spectrum.

The hardness of the films was measured with a nanoindenter, using a three-sided pyramidal indenter and by monitoring load and displacement continuously during the loading-unloading cycle. This instrumental indenter has a depth resolution better than 0.1 nm and a load resolution of 0.5 µN. Results from these tests indicated film hardness of the carbon nitride of 10–12 GPa compared to 4–5 GPa for borosilicate glass and 6–7 GPa for single crystal silicon.

A scratch generated by a 10 g force on a corundum point ($Al_2O_3$, sapphire, or aluminum oxide) which has a MOHS hardness of 9, deeply scratched a silicon wafer in the non-filmed upper half of a silicon wafer but did not scratch the carbon nitride film in the lower half. Silicon has a hardness of 8 on the MOHS scale, as does fused quartz ($SiO_2$) which is among the hardest of all glasses. Since the carbon nitride coating was not scratched by the $Al_2O_3$, it is apparent that it is harder than the $Al_2O_3$ and therefore an extremely useful hard coating. Tests with diamond scribes indicated the film was not as hard as diamond.

Example 5: STM analysis

An ultrahigh vacuum scanning tunneling microscope (STM) with tungsten tips was used to characterize surface topology of the film on a polished silicon wafer. The two-point sample resistance was 7 kOhms, and the STM imaging conditions were 60 pA at +4 V sample bias. The STM image did not show evidence of crystalline structure but rather suggests a coalescence of grains with a characteristic feature size of 60 nm. The cross-sectional profile indicated a surface roughness on the order of 10 nm.

Example 6: TEM analysis

Morphology and crystallinity were also examined using transmission electron microscopy (TEM) on carbon nitride films which had been mechanically removed from a poorly-adherent alumina substrate. Electron diffraction indicated that the films, both before and after a 600 degree centigrade anneal in air, were essentially amorphous in nature. Only broad, diffuse rings were observed in the diffraction pattern. Moreover, the structure indicated nucleation and growth of merely spherical islands with eventual filling between the islands. The size of the features seen was consistent with the STM analysis: they both indicated a size of 60 nm.

Example 7: X-ray analysis

X-ray wavelength dispersive spectroscopy (WDS), X-ray photoelectron spectroscopy (XPS) and secondary ion mass spectrometry (SIMS), were used to analyze the composition of the films. WDS was considered the most accurate method, but the X-ray emission required a rather thick (approximately 1 μm) film for best results. However, XPS with a spot size of 0.5 cm was used to find the average surface composition, and SIMS was used for depth profiling to establish film thickness (using a profilometer) and uniformity. WDS was performed on four different films at multiple locations and the carbon nitrogen ratio varied from 61/39 to 64/36 on films produced by magnetron sputtering in 0.3 Pa N2 at 50 degrees centigrade and with a substrate temperature of 170 degrees centigrade. WDS results for an ion-impacted film at 0.2 Pa N2 indicated a 69/31 ratio of carbon to nitrogen in weight fraction. SIMS depth profiling was performed on two films. One, produced with the magnetron alone, was 1 μm thick and gray; the second film (40 nm thick), produced with a 100 eV nitrogen ion beam and simultaneous carbon sputtering, was transparent. Since the C/N ratio is similar in both films examined by SIMS and the thicker film had 36% N as determined by WDS, we infer that the thinner film also has approximately 36% N. Both the 1 μm and the 40 nm thick films had carbon to nitrogen SIMS unnormalized signal ratios of approximately 50:1, which were constant throughout the film. The thickness of the films was determined by calibrating the depth of the SIMS profile with a stylus profilometer trace across the sputtered crater.

Example 8: Raman spectra analysis

Six of the films were observed using 514.5 nm Raman spectra. The carbon nitride films on glass and silicon all indicated a broad peak signal in the 1300–1700 wave number region, which is similar to the two broad peaks of nitrogen-enriched amorphous carbons. The results showed a presence of very thin films, even when the transparent films were otherwise invisible.

Lastly, it is to be noted that various changes and modifications are apparent to those skilled in the art. Such changes and modifications are to be understood as included within the scope of the present invention as defined by the appended claims, unless they depart therefrom.

What is claimed is:

1. A process for producing a transparent, carbon nitride film on a substrate comprising:

sputter depositing carbon atoms from a carbon target onto a substrate using a magnetron sputter gun; and simultaneously depositing nitrogen atoms onto the substrate from an ion beam source in an atmosphere of less than 2.5 Pa of nitrogen gas to produce a carbon nitride film having a nitrogen content of about 36% and having a transmittance of at least 95% compared to glass throughout the visible spectrum when the film has a thickness of 40 nm.

2. A process of claim 1, wherein the sputter pressure of nitrogen is from 0.2 to 0.3 Pa.

3. A process of claim 1, wherein the sputter deposition power is from 100 to 400 W for a 20 $cm^2$ target.

4. A process of claim 1, wherein the magnetron sputtering is rf, and is at 150 to 200 W for a 20 $cm^2$ target.

5. A process of claim 1, wherein 10 $W/cm^2$ sputtering is used.

6. A process of claim 1, wherein the ion beam voltages range from 20 to 500 V.

7. A process of claim 6, wherein ion beam voltage is in the range of 20 to 100 V.

8. A process of claim 7, which further comprises an amperage in the range of 5 to 10 mA.

9. A process of claim 1, wherein the ion beam amperes are in the range of 2 to 10 mA.

10. A process of claim 1, wherein the substrate is chosen from the group consisting of: silicon oxides, aluminum oxides, fused quartz, glass, copper, PMMA, polycarbonates, and nickel alloys.

11. A process of claim 10, wherein the substrate is a transparent glass.

12. A process of claim 1, wherein the ion source to target distance is in the range of 5 to 15 cm.

13. A process of claim 12, wherein the ion source to target distance is 10 cm.

14. A process of claim 1, wherein the substrate temperature is in the range of 50 to 200 degrees centigrade.

15. A process for producing a transparent, carbon nitride film on a substrate comprising:

sputter depositing carbon atoms from a carbon target onto a substrate using a magnetron sputter gun; and simultaneously depositing nitrogen atoms onto the substrate from an ion beam source in an atmosphere of less than 2.5 Pa of nitrogen gas to produce a carbon nitride film having a nitrogen content of about 36% and having a transmittance of at least 95% compared to glass for photons having energies of 0.5 to 3 eV when the film has a thickness of 40 nm.

* * * * *